(12) United States Patent
Rossini et al.

(10) Patent No.: US 9,548,345 B2
(45) Date of Patent: Jan. 17, 2017

(54) DISPLAY SCREEN HAVING ORGANIC LIGHT-EMITTING DIODES

(71) Applicant: COMMISSARIAT A L'ENERGIE ATOMIQUE ET AUX ENERGIES ALTERNATIVES, Paris (FR)

(72) Inventors: Umberto Rossini, Coublevie (FR); Henri Doyeux, Beaucroissant (FR); Bernard Aventurier, Saint Joseph de Riviere (FR); Eva Serres, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/439,758

(22) PCT Filed: Nov. 28, 2013

(86) PCT No.: PCT/FR2013/052887
§ 371 (c)(1),
(2) Date: Apr. 30, 2015

(87) PCT Pub. No.: WO2014/083285
PCT Pub. Date: Jun. 5, 2014

(65) Prior Publication Data
US 2015/0270325 A1   Sep. 24, 2015

(30) Foreign Application Priority Data
Nov. 30, 2012 (FR) .................... 12 61460

(51) Int. Cl.
*H01L 27/32* (2006.01)
*G02B 27/01* (2006.01)

(52) U.S. Cl.
CPC ....... *H01L 27/3276* (2013.01); *G02B 27/0101* (2013.01); *H01L 27/3248* (2013.01); *H01L 27/3262* (2013.01); *H01L 2227/323* (2013.01); *H01L 2251/5323* (2013.01)

(58) Field of Classification Search
CPC .............................................. H01L 2251/5323
See application file for complete search history.

(56) References Cited

U.S. PATENT DOCUMENTS

| 2003/0127650 A1 | 7/2003 | Park et al. |
| 2004/0095064 A1 | 5/2004 | Lu |
| 2005/0184672 A1 | 8/2005 | Lee |
| 2007/0176538 A1 | 8/2007 | Winters et al. |
| 2013/0111954 A1 | 5/2013 | Koo et al. |

FOREIGN PATENT DOCUMENTS

| EP | 2312561 | 4/2011 |
| FR | 2779869 | 12/1999 |
| WO | 9966559 | 6/1999 |
| WO | 2004023575 | 3/2004 |

OTHER PUBLICATIONS

Written Opinion of International Searching Authority for PCT/FR2013/052887, dated Mar. 17, 2014, English Translation.
French Search Report for PCT/FR2013/052887, dated Mar. 17, 2014.

*Primary Examiner* — Lex Malsawma
(74) *Attorney, Agent, or Firm* — Kevin R. Erdman; Brannon Sowers & Cracraft PC

(57) ABSTRACT

The invention relates to a matrix display screen which includes, in sequence: a mounting (50); at least one first metal portion (156); a stack of layers (52, 72, 86, 104) including transistors (TFT$_1$, TFT$_2$); and organic light-emitting diodes (32).

18 Claims, 4 Drawing Sheets

DISPLAY SCREEN HAVING ORGANIC LIGHT-EMITTING DIODES

CROSS-REFERENCE TO RELATED APPLICATIONS

The present application is a National Stage of PCT International Application Serial Number PCT/FR2013/052887, filed Nov. 28, 2013, which claims priority under 35 U.S.C. §119 of French patent Application Serial Number 12/61460, filed Nov. 30, 2012, the disclosures of which are incorporated by reference herein.

BACKGROUND OF THE INVENTION

Field of the Invention

The present disclosure relates to a display screen comprising organic light-emitting diodes, particularly a display screen for a head-up display.

Description of the Related Art

Head-up displays, also known as HUDs, are augmented reality display systems which enable to integrate visual information in a real scene seen by an observer. In practice, such systems may be placed in a helmet visor, in the cockpit of a plane, or in the interior of a vehicle. They are thus positioned at a short distance from the user's eyes, for example, a few centimeters or tens of centimeters away.

The visual information is provided by a display screen. Conventionally, it is a cathode-ray tube screen. The current tendency is to replace the cathode-ray tube screens of head-up displays with matrix display screens of smaller bulk. It would be desirable to be able to use organic light-emitting diode matrix display screens which comprise display pixels arranged in rows and in columns.

However, in a head-up display, the display screen should be capable of providing a luminance of at least 70,000 candelas per square meter. This may correspond to currents having excessive intensities, incompatible with the proper operation of conventional organic light-emitting diode display screens.

SUMMARY

Thus, an embodiment provides a matrix display system successively comprising:
 a support;
 at least a first metal portion;
 a stack of layers including transistors; and
 organic light-emitting diodes.

According to an embodiment, the first metal portion is connected to at least one of the transistors.

According to an embodiment, the first metal portion extends opposite a plurality of display pixels.

According to an embodiment, the first metal portion extends opposite all the display pixels.

According to an embodiment, each display pixel comprises at least one of said transistors, the first metal portion being connected to said transistor for each display pixel.

According to an embodiment, the metal portion is solid.

According to an embodiment, the metal portion comprises through openings.

According to an embodiment, the screen further comprises an electrode connected to the cathode of each light-emitting diode, and at least a second metal portion, at the same level as the first metal portion, connected to the electrode.

According to an embodiment, the second metal portion extends along an edge of the first metal portion.

According to an embodiment, the screen comprises a plurality of second metal portions, each second metal portion extending along an edge of the first metal portion and being connected to the electrode.

According to an embodiment, the stack comprises third metal portions, the thickness of the third metal portions being strictly smaller than the thickness of the first metal portion.

According to an embodiment, the transistors comprise thin-layer transistors.

An embodiment also provides a head-up display comprising a display screen such as previously defined.

An embodiment also provides a method of forming a matrix display screen, comprising the successive steps of:
 providing a support;
 forming on the support at least one first metal portion;
 forming, on the first metal portion, a stack of layers including transistors; and
 forming organic light-emitting diodes on the stack.

According to an embodiment, the method comprises, after the step of forming the stack and before the step of forming the organic light-emitting diodes, the step of depositing a planarization layer on the stack.

According to an embodiment, the transistors are made of polysilicon deposited at low temperature or LTPS technology.

According to an embodiment, the first metal portion is formed by a damascene method.

According to an embodiment, the method comprises forming at least one contacting area between one of the transistors and the first metal portion.

BRIEF DESCRIPTION OF THE DRAWINGS

The foregoing and other features and advantages will be discussed in detail in the following non-limiting description of specific embodiments in connection with the accompanying drawings, among which.

For clarity, the same elements have been designated with the same reference numerals in the various drawings and, further, as usual in the representation of circuits, the various drawings are not to scale.

DETAILED DESCRIPTION

In the following description, unless otherwise indicated, terms "almost", "substantially", "approximately", and "in the order of" mean "to within 10%".

Figure 1:
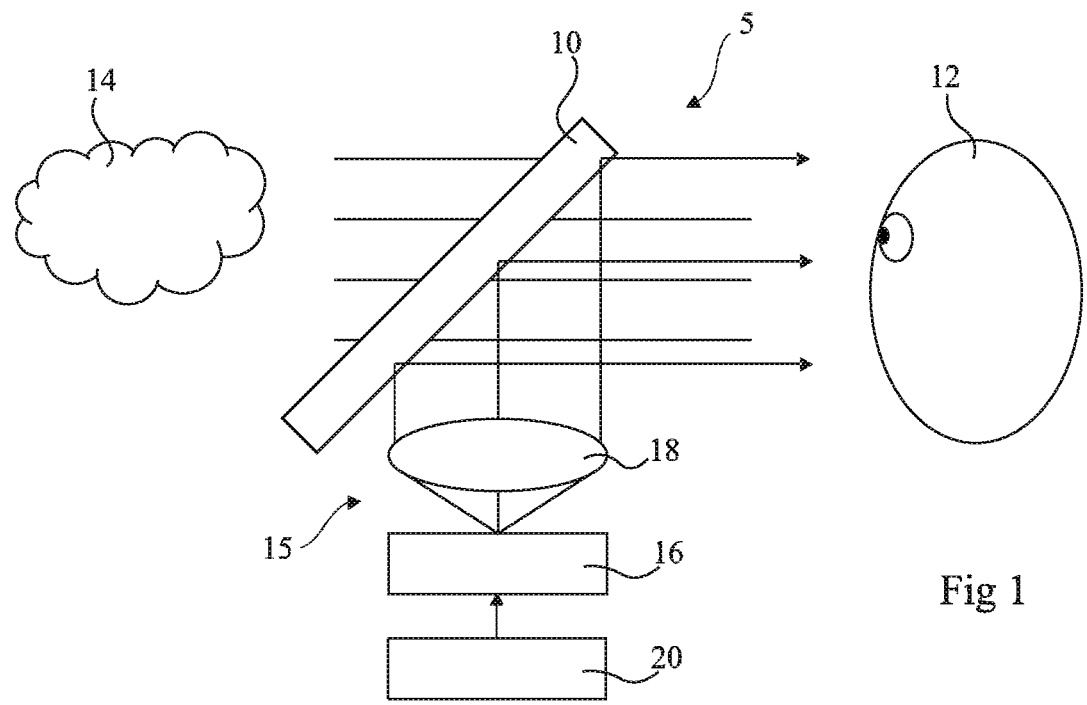
FIG. 1 shows in the form of a block diagram an example of head-up display.

FIG. 1 schematically illustrates the operation of a head-up display 5.

A beam splitter 10 is placed between the eye of a user 12 and a scene to be observed 14. The objects of scene 14 to be observed are generally located at infinity or at a long distance from observer 12. Beam splitter 10 is inclined according to a 45° angle relative to an axis connecting scene 14 and observer 12. Beam splitter 10 enables to transmit the information originating from scene 14 to observer 12 without altering this information.

A projection system 15 is provided to project an image seen by observer 12 at the same distance as the real image of scene 14 and to overlay it thereon. This system comprises a display screen 16 located at the primary focal point of an optical system 18. Display screen 16 is controlled by a display screen control unit 20 which determines the images to be displayed, for example, from signals provided by sensors, not shown.

Projection system 15 is placed perpendicularly to the axis connecting scene 14 and observer 12 so that the beam originating from optical system 18 reaches beam splitter 10 perpendicularly to this axis. The beam originating from optical system 18 thus reaches beam splitter 10 with a 45° angle relative to its surface and is reflected towards observer 12. The image displayed on screen 16 is collimated at infinity by optical system 18. Observer 12 does not have to make any effort of accommodation, which limits his/her visual fatigue. Beam splitter 10 combines the image of scene 14 and the image originating from projection system 15, whereby observer 12 visualizes an image comprising the projected image overlaid on the image of scene 14.

Display screen 16 generally is a cathode ray tube display screen. It would be desirable to be able to use a matrix display screen instead of a cathode ray tube screen, particularly to decrease the screen bulk. The smallest element of a digital image capable of being displayed by matrix display screen 16 is called image pixel. The smallest element of screen 16 for displaying an image is called display pixel. For a color screen, the displaying of one image pixel may require a plurality of display pixels, for example, red, green, and blue pixels. The display pixels of a matrix display screen are evenly distributed in rows and in columns. As an example, a monochrome display screen 16, used in a head-up display, may typically comprise from 300 to 1,500 rows and from 300 to 1,500 columns, for example 640 columns and 480 rows. As an example, all display screens adapted to the VGA (Video Graphics Array) display standard may be envisaged.

It would be desirable to be able to use an organic light-emitting diode or OLED matrix display screen as a display screen 16 of a head-up display.

Figure 2:
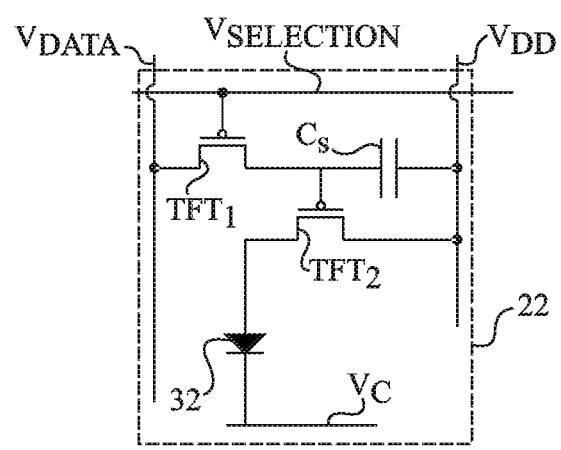
FIG. 2 partially and schematically shows the equivalent circuit of an example of display pixel of an organic light-emitting diode matrix display screen.

FIG. 2 partially and schematically shows an example of a display pixel 22 of an OLED matrix display screen. Each display pixel 22 comprises an organic light-emitting diode 32, two P-type field-effect transistors $TFT_1$ and $TFT_2$, and a capacitor $C_S$. The cathode of diode 32 is connected to a cathode electrode $V_C$ which may be common to all the display pixels 22 of the screen. For each row of the screen, a selection line $V_{SELECTION}$ is connected to the gate of transistor $TFT_1$ of all the display pixels in the row. For each column of the screen, a line of transmission of a data signal $V_{DATA}$ is connected to one of the conduction terminals of transistor $TFT_1$ of each display pixel in the column. The other conduction terminal of transistor $TFT_1$ is connected to an armature of capacitor $C_S$ and to the gate of transistor $TFT_2$. For each screen column, a power supply line $V_{DD}$ is connected, for each display pixel 22 in the column, to the other armature of capacitor $C_S$ and to a conduction terminal of transistor $TFT_2$, the other conduction terminal of transistor $TFT_2$ being connected to the anode of diode 32.

The activation of display pixel 22 comprises a selection phase and an emission phase. During the selection phase, transistor $TFT_1$ is conductive. Capacitor $C_S$ is charged with the voltage applied to line $V_{DATA}$, which depends on the light emission intensity desired for diode 32. During the emission phase, line $V_{DD}$ is set to a high reference potential and cathode electrode $V_C$ is set to a low reference potential. A current flows through diode 32, the intensity thereof being controlled by transistor $TFT_2$ and depending on the voltage across capacitor $C_S$.

Figure 3:
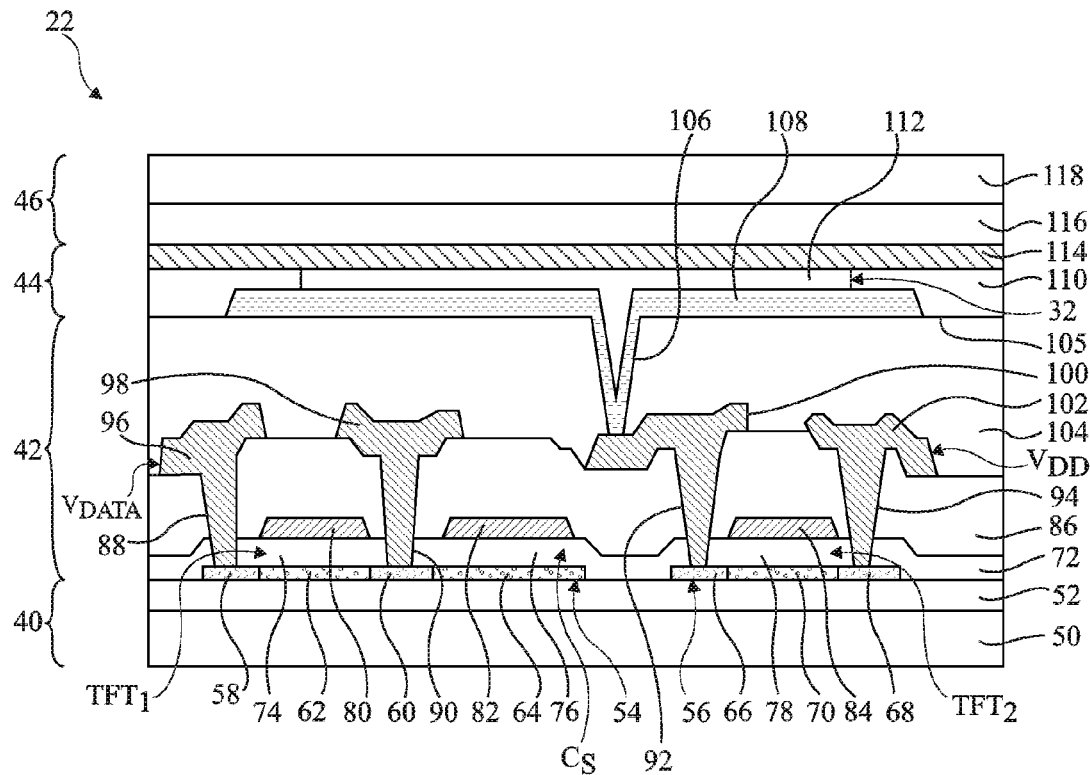
FIG. 3 shows a partial simplified transverse cross-section view of the display pixel of FIG. 2 according to an example where the display pixel is formed with thin-layer transistors.

FIG. 3 shows pixel 22, seen along a transverse cross-section, in the case where transistors $TFT_1$ and $TFT_2$ are thin-layer transistors.

Each display pixel 22 successively comprises from bottom to top:

an area 40 which is especially used as a support for the entire screen;

an area 42 comprising transistors $TFT_1$ and $TFT_2$ and conductive lines $V_{DATA}$, $V_{SELECTION}$, and $V_{DD}$;

an area 44 comprising diode 32 and cathode electrode $V_C$; and an area 46 which is especially used as a protection coating.

A substrate 50 is conventionally used to form area 40. In the present example, the light radiation emitted by diodes 32 is intended to be seen from above in FIG. 3. Substrate 50 may be made of an insulating or conductive material. Preferably, substrate 50 is made of a material having a good heat conductivity, for example, a semiconductor material to help dissipating the heat generated by the transistors and the diodes, particularly silicon, or a metallic material.

As an example, the transistors of area 42 are thin-layer transistors. The source, drain, and channel regions of the transistors are then formed in thin layers of a semiconductor material having a thickness in the order of or smaller than some hundred nanometers, for example, amorphous silicon, microcrystalline silicon, polysilicon, single-crystal silicon, cadmium selenide, or zinc oxide. Any type of thin-layer transistor manufacturing method may be implemented. As an example, when the semiconductor material is polysilicon, the thin layer transistor manufacturing method may be a method based on low temperature polysilicon or LTPS method.

More specifically, area 42 comprises:

an insulating layer 52, for example, made of silicon oxide, covering substrate 50;

portions 54, 56 of a semiconductor material, particularly polysilicon or amorphous silicon, formed on layer 52. Portion 54 comprises portions 58, 60 corresponding to the source or drain regions of transistor $TFT_1$, a portion 62 corresponding to the channel region of transistor $TFT_1$, and a portion 64 forming a lower electrode of capacitor $C_S$. Portion 56 comprises portions 66, 68 corresponding to the source or drain regions of transistor $TFT_2$ and a portion 70 corresponding to the channel region of transistor $TFT_2$;

a dielectric layer 72, for example, made of silicon oxide, covering the portions of semiconductor material 54, 56 and layer 52, and used as a gate insulator 74 for transistor $TFT_1$, as a dielectric layer 76 for capacitor $C_S$, and as a gate insulator 78 for transistor $TFT_2$;

metal portions, formed on dielectric layer 72, particularly a metal portion 80 forming the metal gate of transistor $TFT_1$, a metal track, not shown, forming selection line $V_{SELECTION}$, a metal portion forming upper electrode 82 of capacitor $C_S$, and a metal portion 84 forming the metal gate of transistor $TFT_2$;

a dielectric layer 86, for example, made of silicon oxide, covering dielectric layer 72 and metal portions 80, 82, 84;

metal vias, only four vias 88, 90, 92, and 94 being shown in FIG. 3, crossing dielectric layers 86 and 72 and coming into contact with source and drain regions 58, 60 of transistor $TFT_1$, with upper electrode 82 of storage capacitor $C_S$, with metal gate 84 of transistor $TFT_2$, with source and drain regions 66 and 68 of transistor $TFT_2$;

metal tracks or portions 96, 98, 100, and 102, formed on dielectric layer 86 in contact with vias 88, 90, 92, 94, metal track 102 forming, in particular, line $V_{DD}$, and metal track 96 forming line $V_{DATA}$;

an insulating layer 104, also called smoothing layer or planarization layer, covering insulating layer 86 and metal tracks 96, 98, 100, and 102 and used to obtain a planar surface 105 having light-emitting diode 32 formed thereon.

As an example, the tracks, the vias, and the metal portions of area 42 are made of molybdenum, titanium, tungsten, of a tungsten and molybdenum alloy, or of aluminum.

As an example, area 42 shown in FIG. 3 is manufactured by the forming of successive layers on substrate 50. As a variation, area 42 is formed on an intermediate support and is then placed on substrate 50, the intermediate support being then removed.

An opening 106 is formed in layer 104 and exposes metal portion 100.

Area 44 comprises:

an anode electrode 108 of light-emitting diode 32 covering layer 104 and extending in opening 106 so that electrode 108 is electrically connected to drain region 66 of transistor $TFT_2$;

an insulating layer 110 formed on layer 104 and a portion of electrode 108;

a light-emitting diode 112 formed on electrode 108, which may itself comprise a stack of a plurality of layers; and a cathode electrode 114 of the light-emitting diode covering diode 112 and insulating layer 110 and extending all over the display screen. Cathode 114 is made of an at least partly transparent conductive material, for example, a silver layer having a thickness in the range from 10 to 25 nm.

Area 46 may comprise:

a color filter 116 covering cathode 114; and a protection layer 118 covering color filter 116.

Further, a metal track covering insulating layer 86 is provided at the periphery of the matrix display screen and is connected to cathode electrode 114.

The thickness of the metal tracks provided on insulating layer 86 is, for a conventional light-emitting diode screen, generally in the order of a few tens of micrometers. Conventionally, power supply line $V_{DD}$ has a 10-μm width for a display pixel having a 40-μm width and the metal track connected to cathode electrode 104 has a 2-mm width.

For a head-up display application, power supply line $V_{DD}$ should be able to transmit several milliamperes and the current collected by the cathode electrode may reach several amperes. For a conventional matrix display screen comprising light-emitting diodes, with the metal track dimensions used to form power supply line $V_{DD}$, significant voltage drops would be obtained on line $V_{DD}$, which might adversely affect the proper operation of the screen, particularly due to the crosstalk phenomenon.

Further, the metal track connected to the cathode electrode should have a thickness of several micrometers, or even than more than 10 μm to have a sufficiently low resistance, which cannot be envisaged. Indeed, it is not possible to form an organic light-emitting diode on too uneven a surface induced by the thickness of the underlying metal tracks since the organic layers of the diode are very thin and are generally deposited by evaporation. Too uneven a surface may generate discontinuities at the level of the deposited organic layers and thus induce short-circuits between the anode and the cathode. It is thus necessary, if the surface is too uneven, to deposit a smoothing layer, for example, made of polyimide, particularly deposited by spin deposition, before the forming of the diodes. But the greater the surface unevennesses, the thicker this smoothing layer should be. In such conditions, the heat removal towards the substrate may be altered. Further, the contact via towards the electrode through this smoothing layer should be all the larger as the layer to be crossed is thick, since it is difficult to form a steep edge of small dimension in a large thickness of organic material. This generates a loss of useful surface area at the pixel.

It is thus difficult to use conventional matrix display screen structures comprising organic light-emitting diodes for a head-up display application.

Thus, an object of an embodiment is to provide a matrix display screen comprising organic light-emitting diodes, which at least partly overcomes some of the disadvantages of existing screens.

Another object is to increase the luminance of the light-emitting diode matrix display screen with respect to a conventional light-emitting diode matrix display screen.

Another object is to decrease the thickness of smoothing layer 104 with respect to a conventional light-emitting diode matrix display screen.

Another object is to decrease the thickness of the metal tracks located on insulating layer 86 with respect to a conventional organic light-emitting diode matrix display screen.

The present invention comprises forming the power supply lines $V_{DD}$ of the display pixels and/or the metal tracks connected to the cathode electrode with conductive tracks, preferably metal tracks, different from those formed on insulating layer 86.

Figure 4:
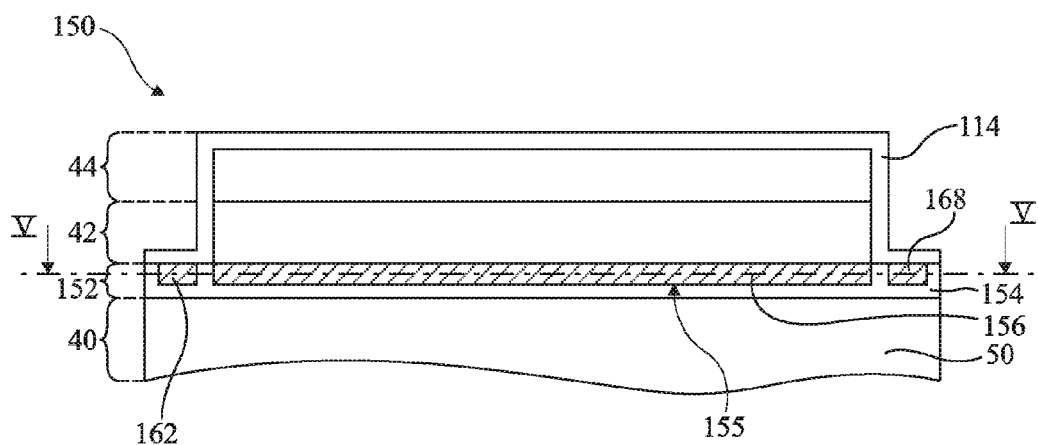
FIG. 4 is a partial simplified transverse cross-section view of an embodiment of a matrix display screen comprising light-emitting diodes.
Figure 5:
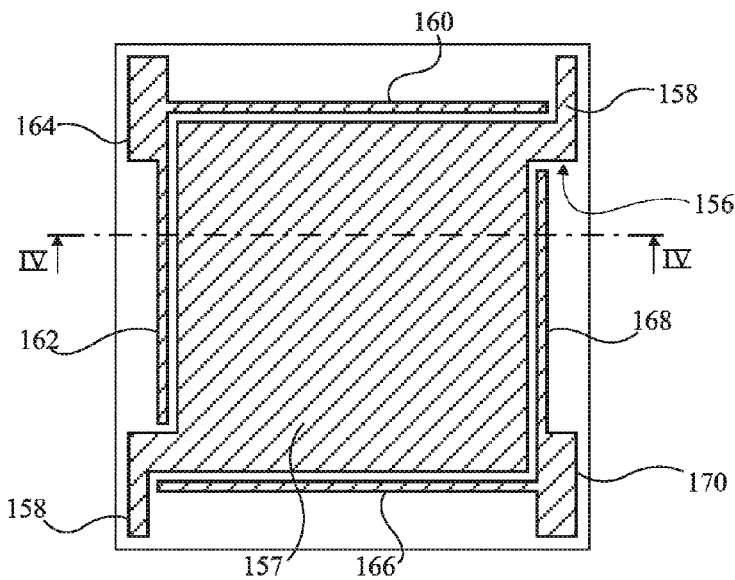
FIG. 5 is a cross-section view of FIG. 4 along line V-V.
Figure 6:
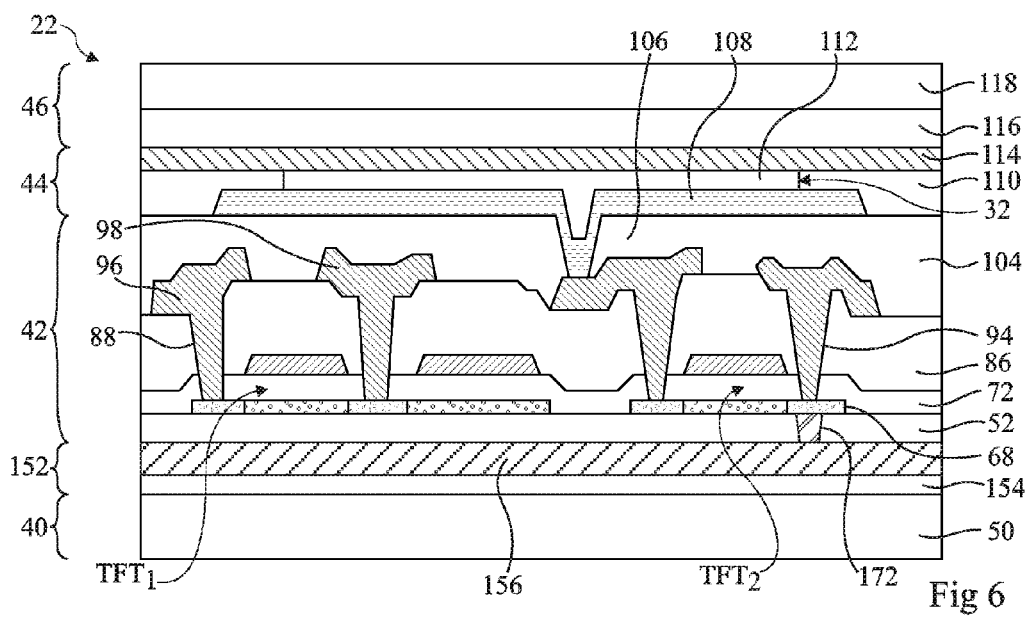
FIG. 6 is a cross-section view similar to FIG. 3 of a display pixel of the screen of FIG. 4.

FIGS. 4 to 6 are cross-section views of a display screen 150 according to an embodiment. In FIG. 4, area 46 is not shown.

As compared with the display screen shown in FIG. 3, display screen 150 according to the present embodiment further comprises an additional area 152 between area 42 having transistors $TFT_1$ and $TFT_2$ and substrate 50 formed therein. Area 152 comprises an insulating layer 154 and metal portions 155 formed at the surface of insulating layer 154. According to an embodiment, an additional layer may be provided between these metal portions and insulating layer 154.

As an example, metal portions 155 are advantageously made of copper, but they may be made of other materials, for example, of aluminum.

As an example, if metal portions 155 are made of copper, the additional underlying layer is made of Ti/TiN or Ta/TaN, conventionally used as a copper diffusion barrier.

As an example, the thickness of metal portions 155 is in the range from 1 to 10 μm, for example, 2 μm, and the thickness of the portion of insulating layer 154 interposed between metal portions 155 and substrate 50 is in the range from 100 to 1,000 nm. The portion of insulating layer 154 interposed between metal portions 155 and substrate 50 electrically insulates metal portions 155 from substrate 50 in the case where the substrate is made of an electrically-conductive material. In the case where substrate 50 is made of an electrically-insulating material, conductive portions 155 may be directly formed on substrate 50.

Metal portions 155 comprise a metal portion 156 comprising a central area 157, shown in FIG. 5, substantially extending under the entire area 42 having the transistors formed therein and extending in connection pads 158. As an example, central area 157 has, in the cross-section plane of FIG. 5, a square cross-section having a side length for example in the range from 10 mm to 200 mm, for example approximately 70 mm, extending, at two opposite corners, in two connection pads 158. Each connection portion 158 is intended, in operation, to be connected to a reference voltage source. In the present embodiment, central area 157 is a continuous metal area.

Metal portions 155 further comprise two metal tracks 160, 162 which extend along two contiguous sides of central area 157 and join at the level of a connection pad 164. Metal portions 155 further comprise two metal tracks 166, 168 which extend along the two other contiguous sides of central area 157 and join at the level of a connection pad 170. As an example, each metal track 160, 162, 166, 168 has a wavelength in the order of the side length of the screen, that is, from 10 mm to 200 mm, for example, approximately 70 mm, and a width in the range from 1 mm to 10 mm, for example, approximately 2 mm. As shown in FIG. 4, cathode electrode 114 laterally extends to be connected, at its periphery, to metal tracks 160, 162, 166, 168.

Metal portion 156 plays the role of previously-described power supply line $V_{DD}$. As shown in FIG. 6, area 42 is formed similarly to what has been previously described in relation with FIG. 3, but for the fact that previously-described power supply line $V_{DD}$ is no longer formed by a metal track formed on insulating layer 86 and that each display pixel comprises a conductive via 172 crossing insulating layer 52 to connect source region 56 of control transistor $TFT_2$ to metal portion 156, as shown in FIG. 4, or crossing insulating layers 52 and 86 to connect the upper electrode of capacitor $C_S$ to metal portion 156.

According to an embodiment, particularly when metal portions 155 are made of copper, metal portions 155 are formed according to an etch method similar to the damascene-type etch method implemented, in particular, in the manufacturing of integrated circuits. According to such a method, insulating layer 154 is deposited on substrate 50. Openings are then formed in insulating layer 154 at the provided locations of metal portions 155, and the openings do not extend across the entire thickness of insulating layer 154. A Ti/TiN or Ta/TaN layer may at this stage possibly be deposited over the entire surface. Then, a copper layer is deposited over the entire obtained structure and penetrates, in particular, into the recesses. A step of chemical mechanical planarization (CMP) is formed to remove the copper layer surface portion to reach the surface of insulating layer 154 and delimit metal portions 155 in the recesses.

According to another embodiment, in the case where metal portions 155 are made of a material which may be etched by chemical etching, the forming of portions 155 may comprise depositing a metal layer on an insulating layer and etching the metal layer to define metal portions 155. Layer 52 can then be formed on top of and between metal portions 155.

The metal tracks of the display screen conducting the currents having the highest intensities are formed by metal portions 155 in the present embodiment, and not by metal portions of area 42 having the transistors of the display pixels formed therein. The dimensions of portions 155 are provided to enable such currents to flow. In particular, according to an embodiment, the thickness of metal portions 96, 98, 100, 102 of area 42 is low, below one micrometer, typically in the order of 0.1 or 0.2 µm, which does not induce too uneven a surface. It is then not necessary to deposit too thick a smoothing layer 104, which would adversely affect the heat dissipation through the substrate. Risks of short-circuits at the light-emitting diode are thus also limited. Thus, the thickness of metal portions 96, 98, 100, 102 of area 42 is at least twice, preferably at least 5 times, more preferably at least 10 times, more preferably still at least 20 times, smaller than the thickness of metal portions 155. The thickness is for example 2 µm for area 155 and 0.1 µm for the tracks of area 42.

Figure 7:
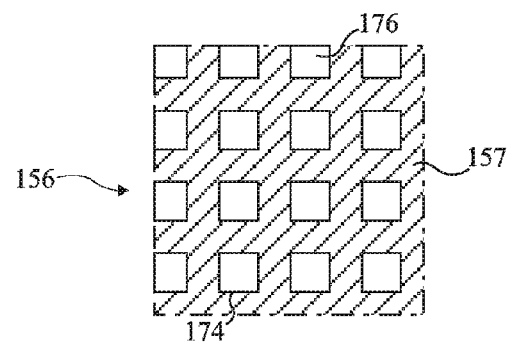
FIG. 7 is a partial enlarged cross-section view similar to FIG. 5 of a variation of the display screen of FIG. 4.

FIG. 7 shows another embodiment of metal portion 156 where central area 157 is crossed by openings 174 filled with an insulating material 176 and separate from one another. As an example, openings 174 are distributed in rows and in columns. Advantageously, the embodiment shown in FIG. 7 makes the forming of metal portions 155 easier. Indeed, in the case where a damascene-type etch method is implemented, it is generally preferable to have a substantially uniform density of metal and insulating portions over the entire surface to be treated, to decrease surface unevennesses, and particularly a dishing during the chem.-mech. polishing step, due to the difference in polishing speed between the metallic and insulating portions.

FIGS. 8A to 8D are cross-section views of structures obtained at steps of an embodiment of a method of manufacturing display screen 150 shown in FIG. 4, where the source and drain regions of transistors $TFT_1$ and $TFT_2$ are formed in a silicon layer, particularly made of single-crystal silicon, which is placed on a multilayer structure comprising metal portions 155.

Figure 8A:
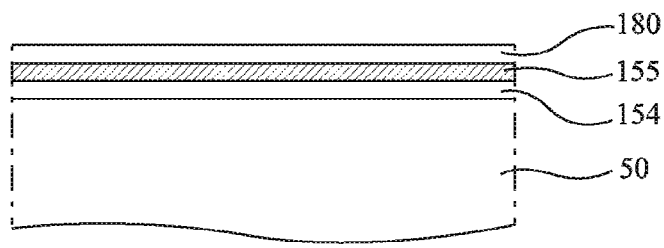
FIGS. 8A to 8D are partial simplified cross-section views of the structures obtained at steps of an embodiment of a method of manufacturing the matrix display shown in FIG. 4.

FIG. 8A shows a multilayer structure successively comprising substrate 50, insulating layer 154, metal portions 155, and an insulating layer 180.

Figure 8B:
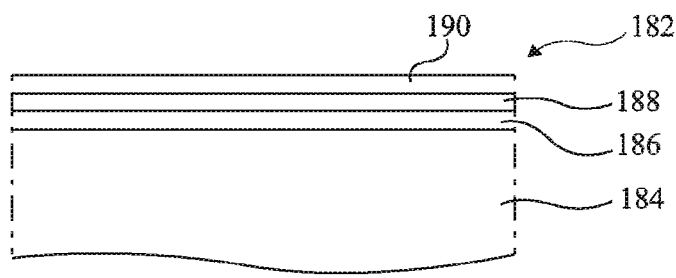

FIG. 8B shows a multilayer structure 182 of SOI type (Silicon On Insulator) successively comprising a substrate 184, an insulating layer 186, a semiconductor layer 188, for example, single-crystal silicon, and an insulating layer 190.

Figure 8C:
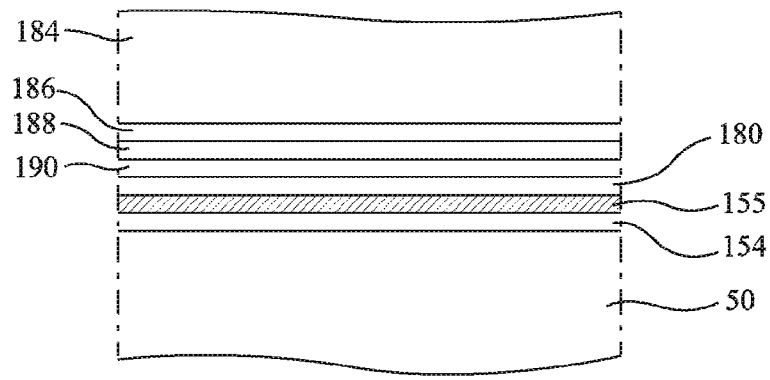

FIG. 8C show the structure obtained after having bonded insulating layers 180 and 190.

Figure 8D:
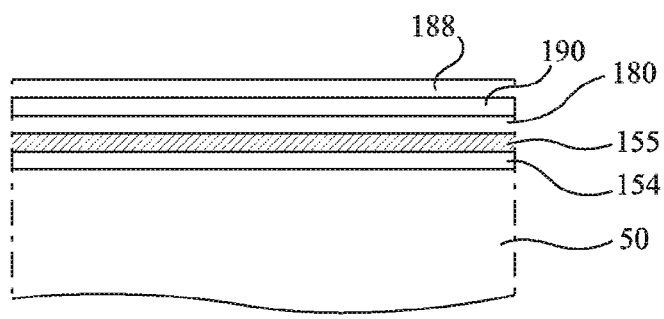

FIG. 8D shows the structure obtained after having removed substrate 184 and insulating layer 186, for example, by etching.

The next steps of the method particularly comprise forming previously-described areas 42, 44, and 46. In particular, the source and drain regions of transistors $TFT_1$ and $TFT_2$ may be formed in semiconductor layer 188.

As a variation, insulating layer 186 of multilayer structure 182 may be replaced with an embrittled area of the semiconductor material forming substrate 184 and semiconductor layer 188. Thereby, after the step of bonding multilayer structure 182, multilayer structure 182 is divided in two portions at the level of the embrittled area.

Specific embodiments have been described. Various alterations and modifications will occur to those skilled in the art. In particular, each display pixel may have a structure different from that shown in FIG. 3 and comprise a larger number of transistors.

The invention claimed is:

1. A matrix display screen successively comprising:
   a support;
   at least a first metal portion and a second metal portion, at the same level as the first metal portion;
   a stack of layers including transistors;

organic light-emitting diodes; and
an electrode connected to the cathode of each light-emitting diode, the second metal portion being connected to the electrode and extending along an edge of the first metal portion, wherein the matrix display screen comprises a plurality of second metal portions, each second metal portion extending along an edge of the first metal portion and being connected to the electrode.

2. The screen of claim 1, wherein the first metal portion is connected to at least one of the transistors.

3. The screen of claim 1, wherein the first metal portion extends opposite a plurality of display pixels.

4. The screen of claim 3, wherein the first metal portion extends opposite all the display pixels.

5. The screen of claim 4, wherein each display pixel comprises at least one of said transistors, the first metal portion being connected to said transistor for each display pixel.

6. The screen of claim 5, wherein the first metal portion is solid.

7. The screen of claim 5, wherein the first metal portion comprises through openings.

8. The screen of claim 1, wherein the stack comprises third metal portions, the thickness of the third metal portions being strictly smaller than the thickness of the first metal portion.

9. The screen of claim 8, wherein the transistors comprise thin-layer transistors.

10. A head-up display comprising a display screen comprising:
a support;
at least a first metal portion and a second metal portion, at the same level as the first metal portion;
a stack of layers including transistors;
organic light-emitting diodes; and
an electrode connected to the cathode of each light-emitting diode, the second metal portion being connected to the electrode and extending along an edge of the first metal portion, wherein the head-up display comprises a display screen having a plurality of second metal portions, each second metal portion extending along an edge of the first metal portion and being connected to the electrode.

11. The screen of claim 10, wherein the first metal portion is connected to at least one of the transistors.

12. The screen of claim 10, wherein the first metal portion extends opposite a plurality of display pixels.

13. A method of forming a matrix display screen comprising the successive steps of:
providing a support;
forming on the support at least a first metal portion and a second metal portion at the same level as the first portion;
forming, on the first metal portion, a stack of layers including transistors;
forming organic light-emitting diodes on the stack; and
an electrode connected to the cathode of each light-emitting diode, the second metal portion being connected to the electrode and extending along an edge of the first metal portion, wherein the matrix display screen comprises a plurality of second metal portions, each second metal portion extending along an edge of the first metal portion and being connected to the electrode.

14. The method of claim 13, comprising, after the step of forming the stack and before the step of forming the organic light-emitting diodes, the step of depositing a planarization layer on the stack.

15. The method of claim 14, wherein the transistors are made of polysilicon deposited at low temperature or LTPS technology.

16. The method of claim 15, wherein the first metal portion is formed by a damascene method.

17. The method of claim 16, comprising forming at least one contacting area between one of the transistors and the first metal portion.

18. The method of forming a matrix display screen comprising the successive steps of:
providing a support;
forming on the support at least a first metal portion and a second metal portion at the same level as the first portion, wherein the first metal portion is formed by a damascene method;
forming, on the first metal portion, a stack of layers including transistors, wherein the transistors are made of polysilicon deposited at low temperature or LTPS technology, and forming at least one contacting area between one of the transistors and the first metal portion;
forming organic light-emitting diodes on the stack; and
an electrode connected to the cathode of each light-emitting diode, the second metal portion being connected to the electrode further comprising, after the step of forming the stack and before the step of forming the organic light-emitting diodes, the step of depositing a planarization layer on the stack, and further comprising the steps of:
providing a multilayer structure comprising the support, the first metal portion, and the second metal portion;
providing an additional support comprising a layer of a semiconductor material;
bonding the additional support to the multilayer structure;
removing a portion of the additional support to expose the layer of the semiconductor material; and
forming the transistors at least partly in the layer of the semiconductor material.

* * * * *